United States Patent
Chen et al.

(10) Patent No.: US 7,074,713 B2
(45) Date of Patent: Jul. 11, 2006

(54) PLASMA ENHANCED NITRIDE LAYER

(75) Inventors: Jian Chen, Austin, TX (US); Stanley M. Filipiak, Pflugerville, TX (US); Yongjoo Jeon, Austin, TX (US); Tab A. Stephens, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/954,400

(22) Filed: Sep. 30, 2004

(65) Prior Publication Data

US 2006/0073698 A1    Apr. 6, 2006

(51) Int. Cl.
*H01L 21/4763* (2006.01)
(52) U.S. Cl. .......................... 438/637; 438/3
(58) Field of Classification Search ............ 438/3, 438/637, 692, 696, 700
See application file for complete search history.

(56) References Cited

U.S. PATENT DOCUMENTS

| 5,807,660 A | 9/1998 | Lin et al. |
| 6,100,559 A | 8/2000 | Park |
| 6,713,873 B1 | 3/2004 | O'Loughlin |
| 6,881,351 B1 * | 4/2005 | Grynkewich et al. ......... 216/22 |

* cited by examiner

*Primary Examiner*—Phuc T. Dang
(74) *Attorney, Agent, or Firm*—David G. Dolezal (57) ABSTRACT

An etch stop layer located over a plasma enhanced nitride (PEN) layer. Interlayer dielectric material is then formed over the etched stop layer. The etch stop layer is used as an etch stop for etching openings in the interlayer dielectric. In some embodiments, integrated circuits built with the PEN layer may include transistors with improved drive current at a given leakage current. Also, integrated circuits with the PEN layer may exhibit reduced parasitic capacitance.

26 Claims, 9 Drawing Sheets

PLASMA ENHANCED NITRIDE LAYER

BACKGROUND OF THE INVENTION

1. Field of the Invention

This invention relates in general to semiconductor devices and in particular to semiconductor devices made using nitride layers.

2. Description of the Related Art

An etch stop layer is utilized in the manufacture of semiconductor wafers for making openings in a layer e.g. of different sizes and depths. With some examples, the etch stop layer (ESL) is of a material or materials that is etch selective with respect to the material in which the opening is being made. The etch stop layer limits the penetration of the etch into layers below the layer in which the desired opening is being made.

What is desired is an improved integrated circuit.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The figures are not necessarily drawn to scale.

DETAILED DESCRIPTION

The following sets forth a detailed description of a mode for carrying out the invention. The description is intended to be illustrative of the invention and should not be taken to be limiting.

FIGS. 1–8 set forth various stages in the manufacture of a semiconductor wafer that utilizes a plasma enhanced nitride (PEN) layer according to one embodiment of the present invention.

Figure 1:
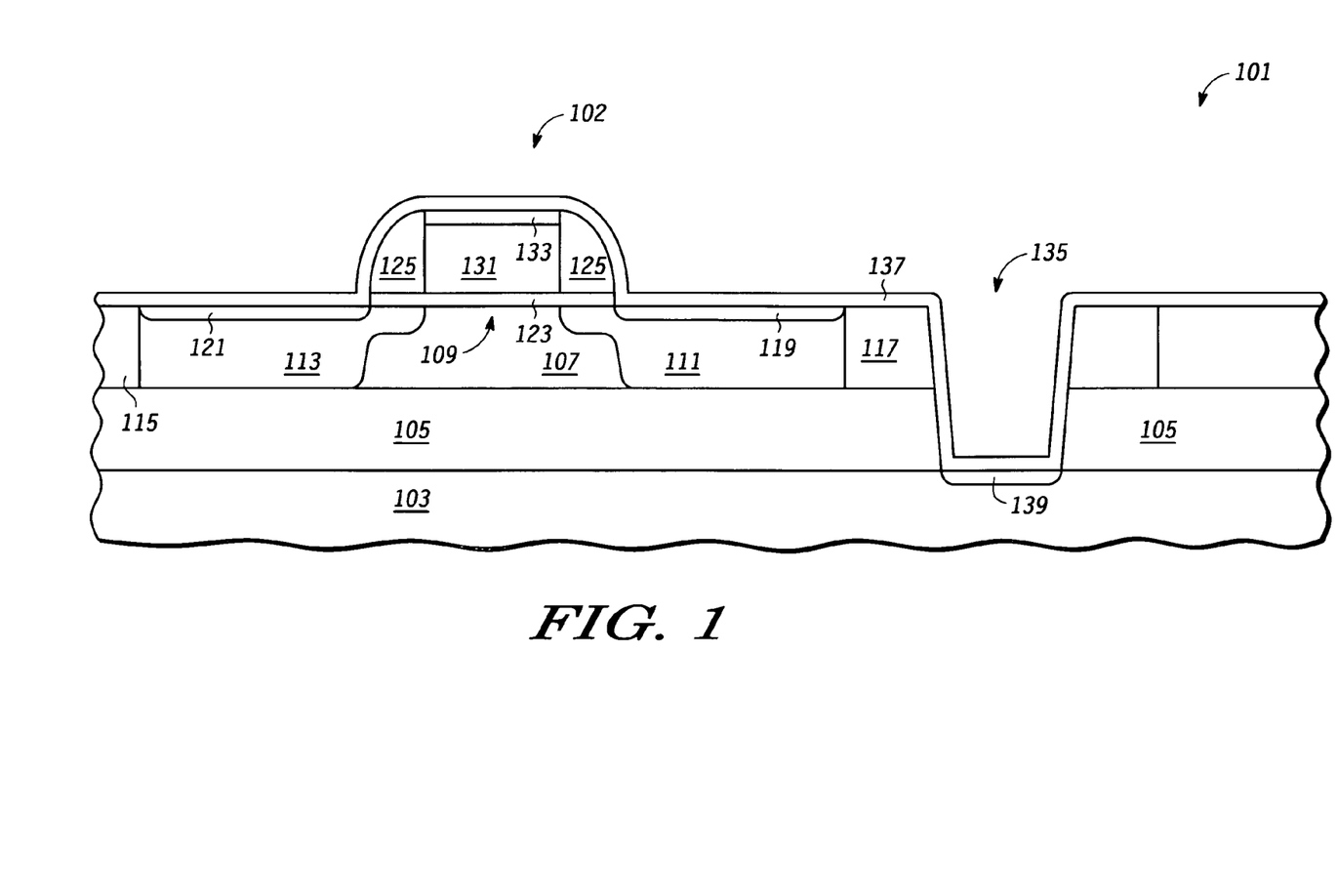
FIG. 1 is a partial side cross-sectional view of one embodiment of a semiconductor wafer during a stage in its manufacture according to the present invention.

FIG. 1 shows a partial side cross-sectional view of wafer 101. Wafer 101 has a semiconductor on insulator configuration (SOI) with a dielectric 105 (e.g. $SiO_2$) located on a semiconductor substrate 103 (e.g. Si, SiGe). A layer 107 of semiconductor material (e.g. Si, SiGe) is located over dielectric 105. Wafer 101 includes a transistor 102. Transistor 102 includes source/drain region 113, source/drain region 111, and channel region 109 which are located in layer 107. Transistor 102 also includes a gate 131 located over layer 107. A sidewall spacer is located adjacent to gate 131. Gate 131 is located on a gate oxide 123. In some embodiments, spacer 125 includes an oxide liner located on oxide 123 and the sidewall of gate 131. Transistor 102 also includes a gate silicide 133 located on gate 131, a source/drain silicide 119 located on source/drain region 111, and a source/drain silicide 121 located on source/drain region 113.

An opening 135 is formed in wafer 101 to substrate 103 where a substrate silicide 139 is subsequently formed. Opening 135 extends through an isolation region 117 (e.g. of $SiO_2$) located in layer 107 and through dielectric 105. Silicide 139 is in electrical contact with substrate 103.

A plasma enhanced nitride (PEN) layer 137 is formed over wafer 101 after the formation of opening 135 and silicide 139. In one embodiment, PEN layer 137 is 36% silicon, 53% nitrogen, and 21% hydrogen by atomic weight. In other embodiments, PEN layer 137 may be of other compositions. In one embodiment, PEN layer 137 is deposited (e.g. by a plasma enhanced chemical vapor deposition (PECVD) process) using a processing tool sold by the NOVELLUS CORP under the trade designation of SEQUEL. In one embodiment, the processing tool is implemented on the CONCEPT 2 mainframe having a SEQUEL chamber by NOVELLUS. In one embodiment, layer 137 has a density of approximately 2.43 grams/cc. In one embodiment, the ratio of to silicon-hydrogen bond to nitrogen-hydrogen bond is 4:1.

In one embodiment, PEN layer 137 is 300 Angstroms (A) thick. In some embodiments, PEN layer 137 has a thickness in the range of 100–500 Angstroms, but may be of other dimensions in other embodiments. In some embodiments, layer 137 having a thickness of more than 500 A may degrade reliability by increasing negative bias temperate instability (NBTI) of an integrated circuit.

Figure 2:
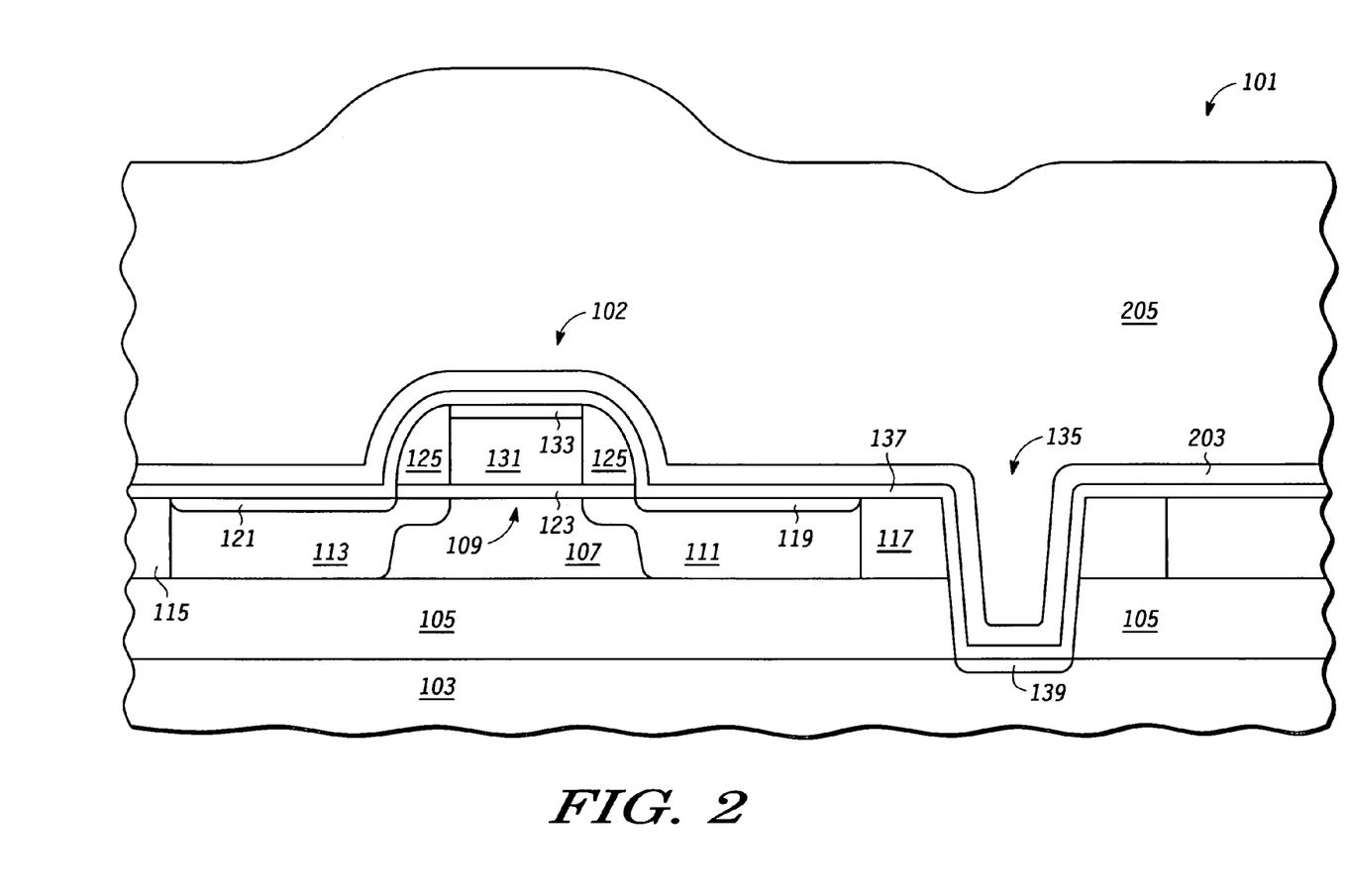
FIG. 2 is a partial side cross-sectional view of an embodiment of a semiconductor wafer during another stage in its manufacture according to the present invention.

FIG. 2 shows a partial side cross-sectional view of wafer 101 after a layer 203 of etch stop material (e.g. silicon rich silicon oxynitride) is deposited e.g. by a PECVD process. In other embodiments, layer 203 may be of other materials such as silicon rich silicon nitride, silicon oxynitride, or a different composition of SION. In one embodiment, layer 203 has a composition of 43% silicon, 15% oxygen, 20% nitrogen, and 22% hydrogen by atomic weight, but may be of other compositions in other embodiments. In one embodiment, layer 203 has a thickness in the range of 300–800 Angstrom, but may have other thicknesses in other embodiments.

A layer 205 of interlayer dielectric material is deposited on layer 203 after layer 203 has been deposited. In one embodiment, layer 205 is made of TEOS, but may be made of other materials in other embodiments. In one embodiment layer 205 has a thickness of 8000 A, but may be of other thicknesses in other embodiments.

Figure 3:
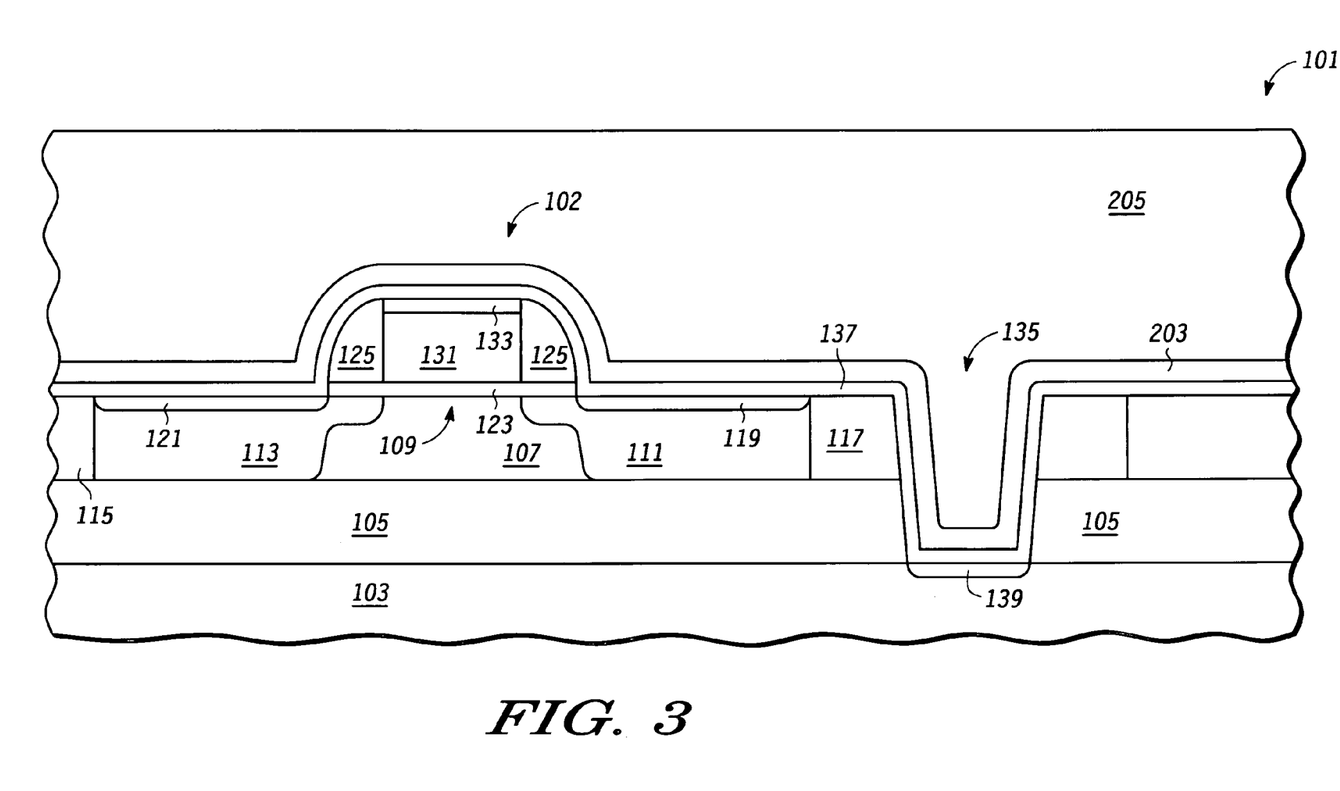
FIG. 3 is a partial side cross-sectional view of an embodiment of a semiconductor wafer during another stage in its manufacture according to the present invention.

FIG. 3 shows a partial side cross-sectional view of wafer 101 after wafer 101 has been subject to a chemical mechanical polishing (CMP) process to planarize layer 205. In one embodiment, layer 205 is planarized to a thickness of 4000 A, but may be planarized to other thicknesses in other embodiments.

Figure 4:
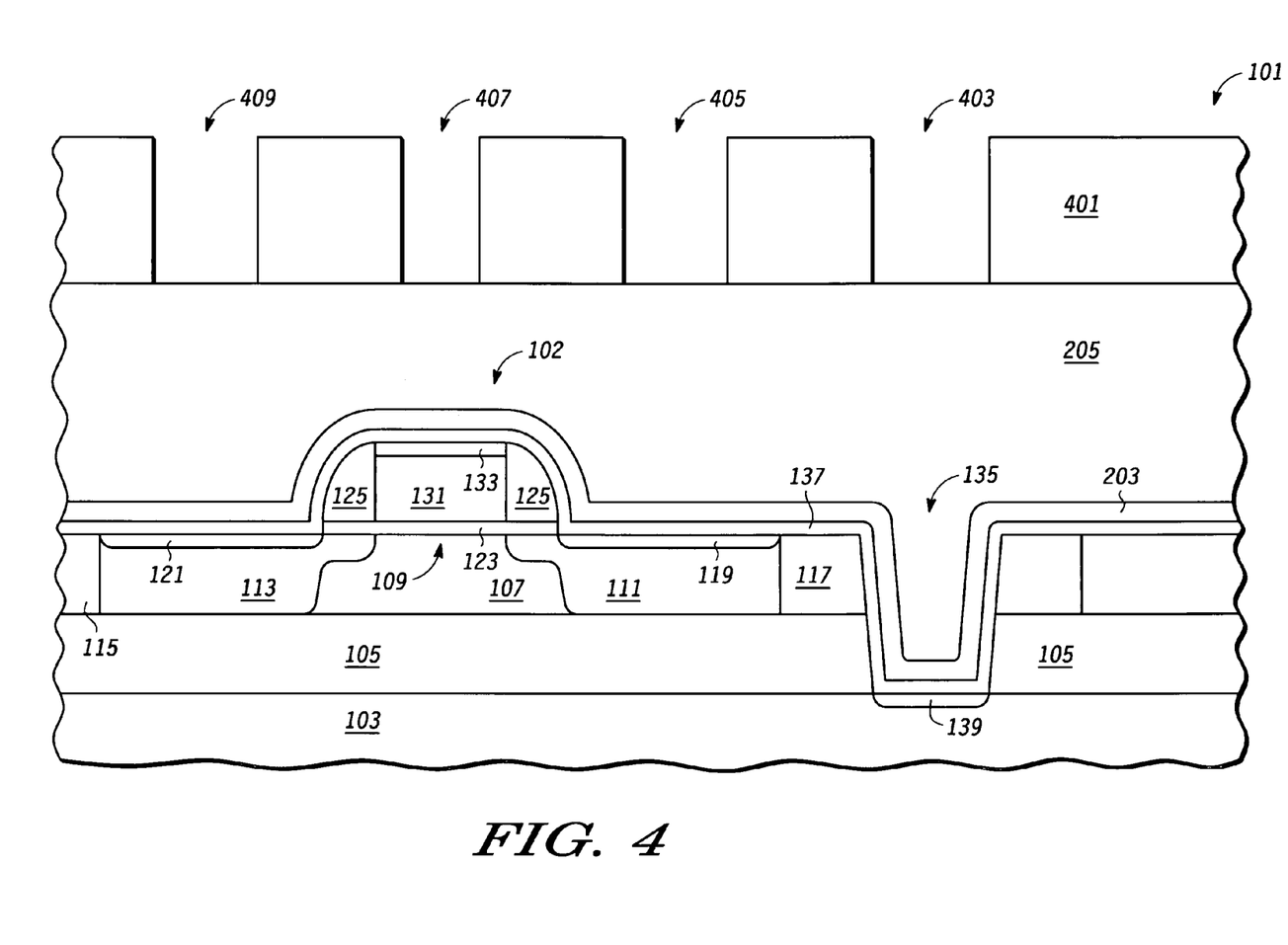
FIG. 4 is a partial side cross-sectional view of an embodiment of a semiconductor wafer during another stage in its manufacture according to the present invention.

FIG. 4 is a partial side cross-sectional view of wafer 101 after a layer of patterning stack 401 has been formed on layer 205 and patterned to form openings 409, 407, 405, and 403. In one embodiment, patterning stack 401 may include patterned photo resist over an organic antireflective coating (ARC). Other embodiments may utilize dry developed bi-layer resist or photo resist over hard mask schemes.

Figure 5:
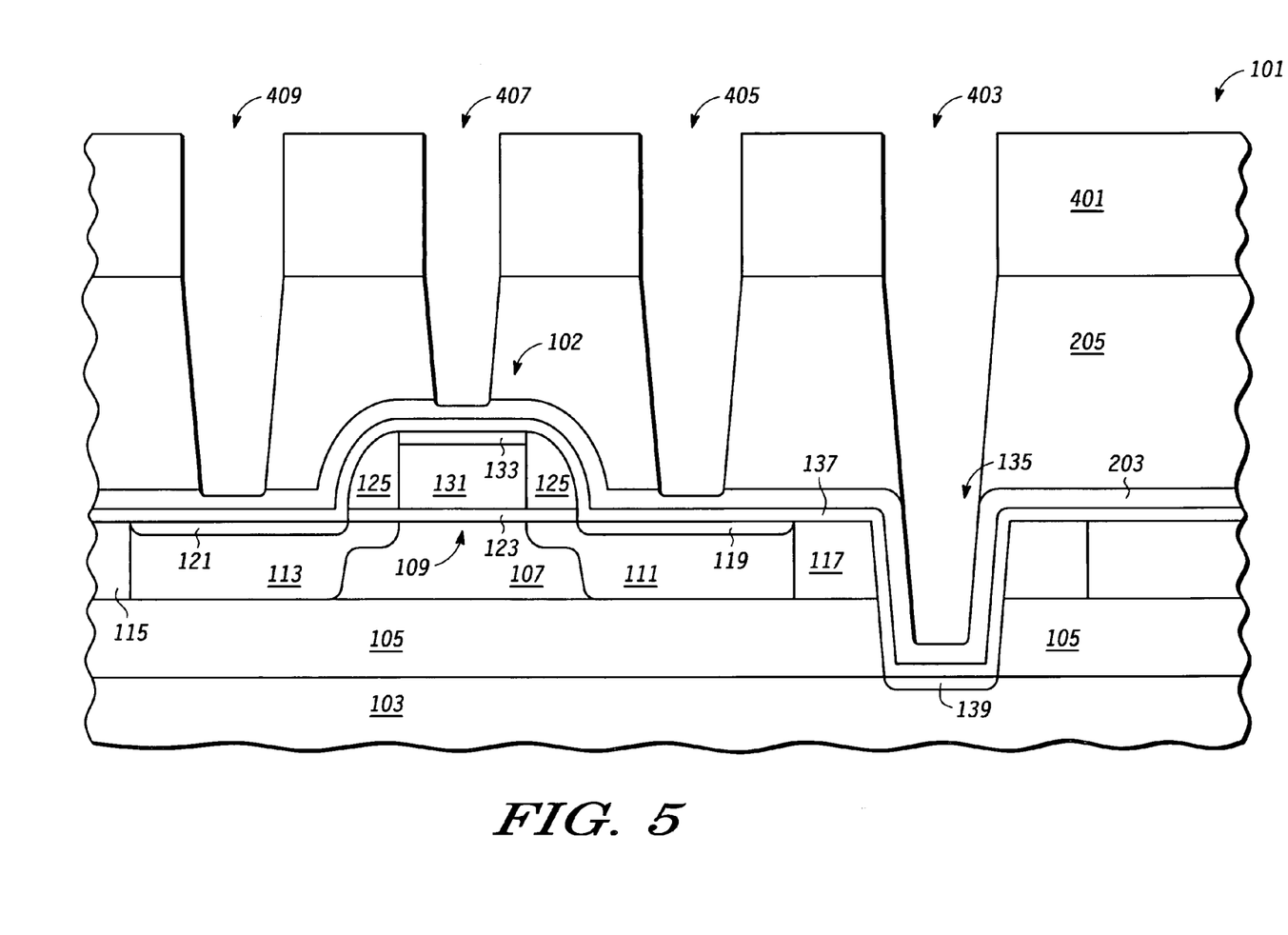
FIG. 5 is a partial side cross-sectional view of an embodiment of a semiconductor wafer during another stage in its manufacture according to the present invention.

FIG. 5 shows a partial side cross-sectional view of wafer 101 after openings in layer 205 have been formed by etching layer 205 through openings 409, 407, 405, and 403. In the embodiment shown, layer 203 is used as an etch stop for the etching of the openings in layer 205. Layer 205 is etched with an etchant (e.g. a $C_4F_8$ based etch) having an etch chemistry that is highly selective with respect to the materials of layers 203 and 137 and non selective to the material of layer 205. In some embodiments, the etchant is more selective to the material of layer 203 than the material of layer 137.

Figure 6:
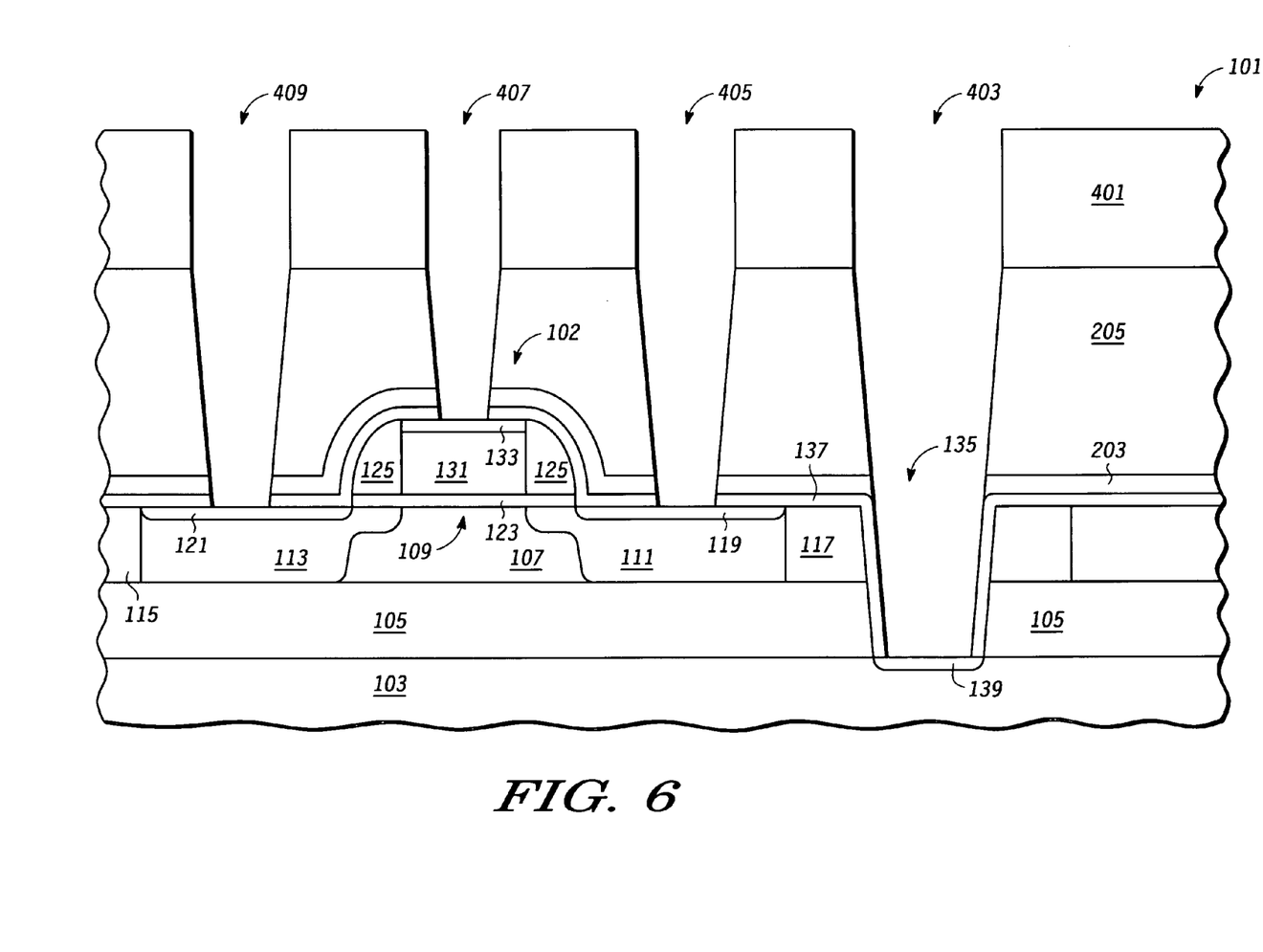
FIG. 6 is a partial side cross-sectional view of an embodiment of a semiconductor wafer during another stage in its manufacture according to the present invention.

FIG. 6 is a partial side cross-sectional view of wafer 101 after portions of layers 203 and 137 in the openings have been removed by etching. In one embodiment, the materials of layers 203 and 137 in the openings are removed by an etchant (e.g. $CH_3F$—$O_2$) that is non selective to both the material of layer 203 and the material of layer 137. In one embodiment, the etchant is selective to the material of layer 205, the materials of silicides 121, 133, 119, and 139, the material of dielectric 105, and the material of isolation region 117.

During the etching of layers 205 and the etching of layers 203 and 137, some of patterning stack 401 maybe eroded or removed, which may lead to rounding or corner loss in the openings of layer 205. However such an effect is not shown in FIGS. 5 and 6.

Figure 7:
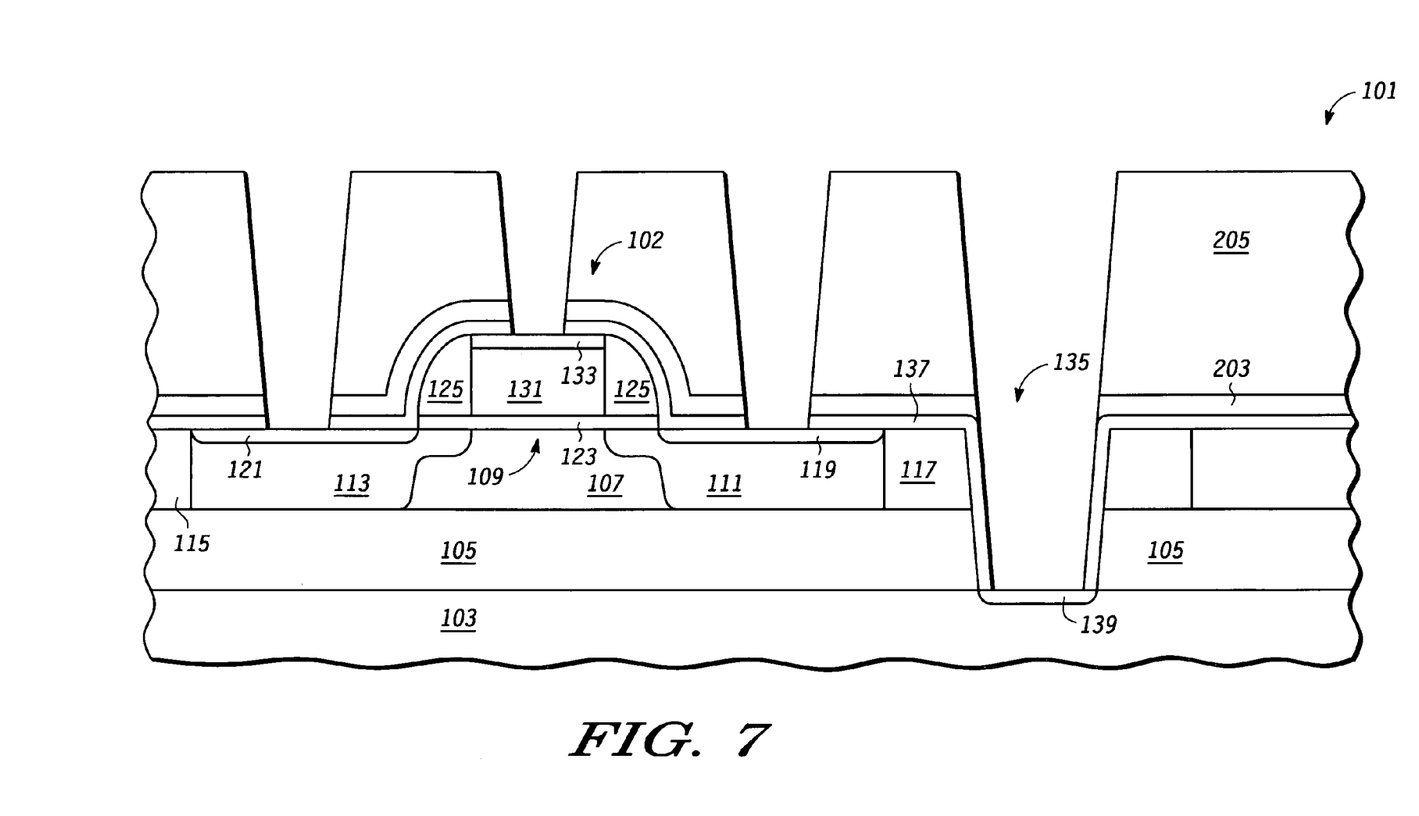
FIG. 7 is a partial side cross-sectional view of an embodiment of a semiconductor wafer during another stage in its manufacture according to the present invention.

FIG. 7 shows a partial side cross-sectional view of wafer 101 after patterning stack 401 has been removed (e.g. by an oxygen based plasma). During the removal of patterning stack 401 (or during the etching of layer 205 or the etching of layers 203 and 137), the openings in layer 205 may exhibit some rounding or corner loss. Also, during the removal of patterning stack 401, polymers formed during the etchings may also be removed. As can be shown in the view of FIG. 7, silicides 121, 133, 119, and 139 are exposed after the removal of patterning stack 401. In some embodiments, patterning stack 401 may be removed prior to the etching of layer 205 and/or the etching of layers 203 and 137.

Figure 8:
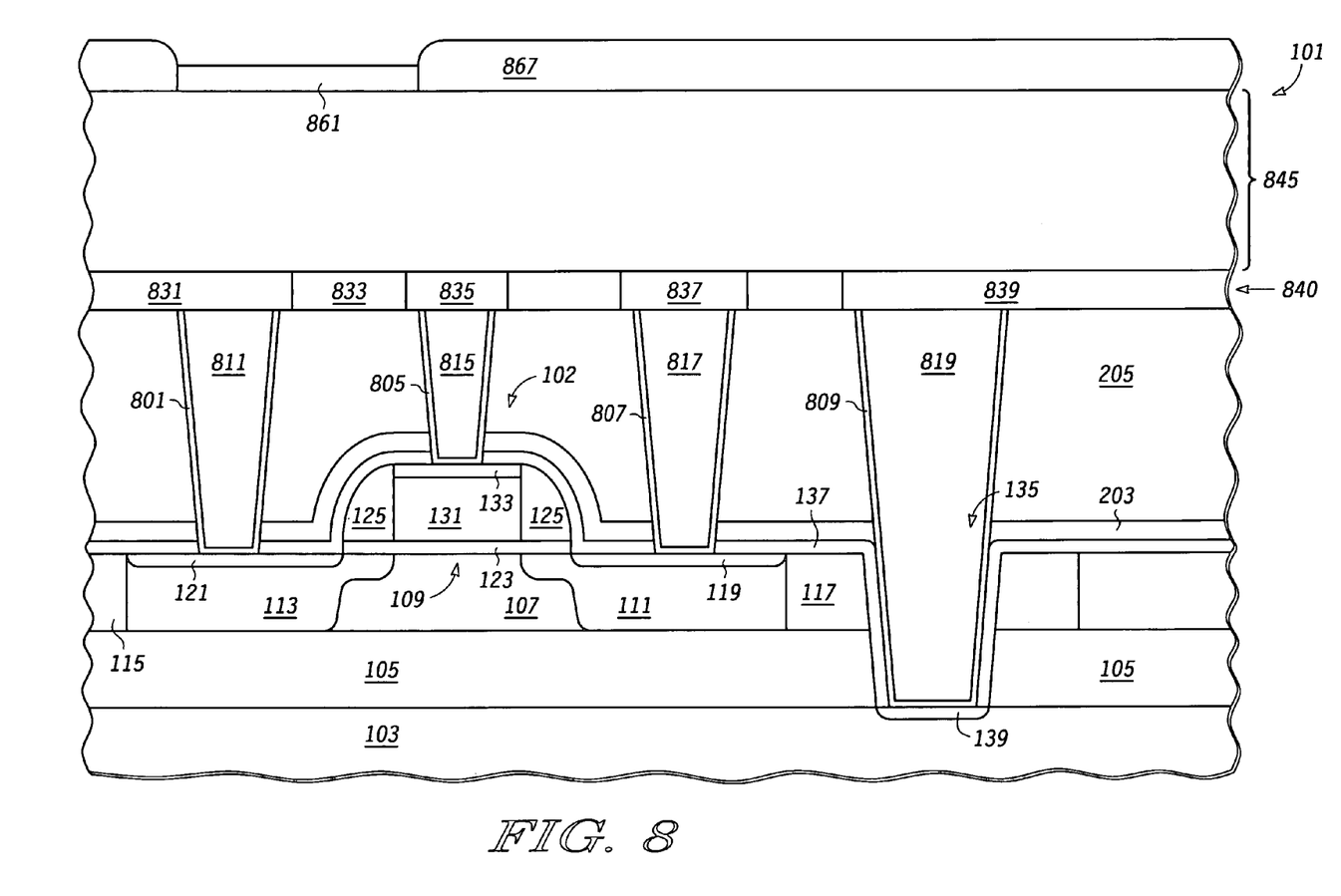
FIG. 8 is a partial side cross-sectional view of an embodiment of a semiconductor wafer during another stage in its manufacture according to the present invention.

FIG. 8 shows a partial side cross-sectional view of wafer 101 after subsequent processing steps have been performed from the stage shown in FIG. 7. After the removal of patterning stack 401, a barrier layer (or layers in some embodiments, e.g. with some embodiments including a seed layer for subsequent layer formation) is formed over wafer 101 in checking the openings of layer 205. In some embodiments, the barrier layer may include titanium, titanium nitride, tantalum, and/or tantalum nitride. Subsequently, a layer of conductive material (e.g. tungsten) is deposited on wafer 101 to fill the openings in layer 205. Wafer 101 is then subject to a CMP process to planarize and remove excess metal above layer 205. During the CMP process, the thickness of layer 205 may be reduced. In some embodiments, separate CMP processes may be utilized for the metal and for the material of layer 205.

After the CMP process, each opening includes a contact which includes a portion of the barrier layer (e.g. portions 801, 805, 807, and 809) and conductive material (e.g. 811, 815, 817, and 819).

Afterwards, interconnects 831, 835, 837, and 839 of interconnect layer 840 (interconnect layer 1) are formed. In one embodiment, interconnects 831, 835, 837, and 839 include copper and are formed by depositing a dielectric stack 833 on wafer 101, wherein stack 833 is subsequently etched to form inlaid trenches in the stack. The trenches are then filled with conductive material and the wafer is polished to form the interconnects in the trenches. In other embodiments, the interconnects may be formed by other processes and/or may include other materials.

In the embodiment shown, interconnect 831 is in electrical contact with the contact of material 811 and portion 801, interconnect 835 is in electrical contact with the contact of material 815 and portion 805, interconnect 837 is in electrical contact with the contact of material 817 and portion 807, and interconnect 839 is in electrical contact with the contact of material 819 and portion 809.

Layer 205 acts as an interlayer dielectric between interconnect layer 1 and gate 131, source/drain regions 113 and 111, and layer 107. Interlayer dielectric refers to dielectric material (e.g. stack 833) between the interconnects as well.

In subsequent process, other interconnect layers, interlayer dielectrics, and vias (collectively shown as layer 845) are formed over interconnect layer 840. Layer 845 includes interconnects and vias electrically coupled to the interconnects of interconnect layer 845. In one embodiment, layer 845 includes 8 additional interconnect layers (interconnect layers 2–9). However, in other embodiments, layer 845 may include a different number of interconnect layers. Afterwards, bond pads e.g. 861 and a passivation layer 867 are formed on layer 845 in the embodiment shown. However, wafers of other embodiments may have other configurations and/or structures.

In subsequent processes, wafer 101 is singulated for form multiple integrated circuits.

Figure 9:
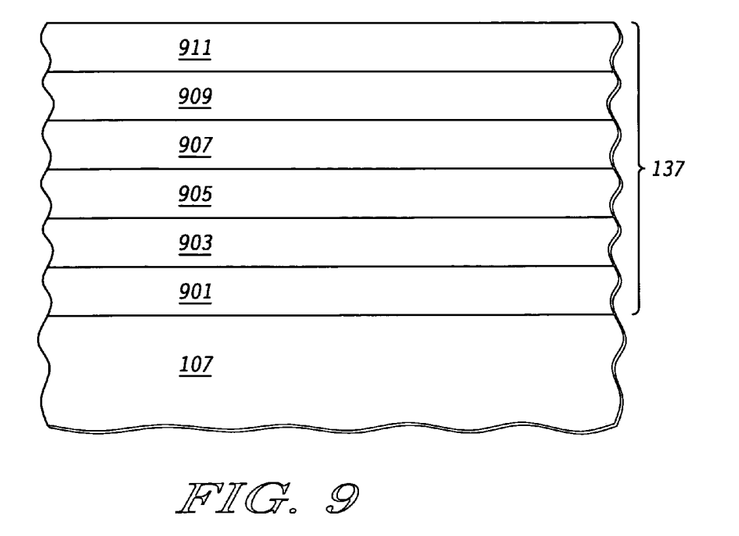
FIG. 9 is a partial side cross-sectional view of an embodiment of a semiconductor wafer during another stage in its manufacture according to the present invention.

FIG. 9 shows a partial side cross-sectional view of wafer 101 after the formation of PEN layer 137. In the embodiment shown, PEN layer 137 includes six layers (layers 901, 903, 905, 907, 909, and 911) of the same PEN material. In one embodiment, each layer is approximately ⅙ of the total thickness of layer 137 (e.g. where layer 137 is 300 A, layer 901 is 50 A).

In one embodiment, each layer of layer 137 is formed with a different processing station in a processing chamber of a processing tool (e.g. with the NOVELLUS SEQUEL processing tool).

In one embodiment, each layer is formed by a plasma enhanced chemical vapor deposition (PECVD) process by reacting silane ($SiH_4$), ammonia ($NH_3$), and nitrogen ($N_2$) gases with radio frequency (RF) at a reduced pressure and elevated temperature. In one embodiment, silane is flowed in the process chamber at a rate in the range of 300–470 sccm, ammonia is flowed at a rate in the range of 2200–3800 sccm, and $N_2$ is flowed at a rate in the range of 2000–3600 sccm. In one embodiment, the chamber pressure is in the range of 1.5–2.4 Torr during the deposition process. In one embodiment, the high frequency (HF) power is in the range of 300–390 watts and the low frequency power (LF) is in the range of 100–200 watts. In one embodiment, the temperature of the chamber is in the range of 300–450 C during the deposition process. In other embodiments, layer 137 may be formed with different gases and/or at different processing conditions. In other embodiments, layer 137 may be a single layer. In other embodiments, layer 137 may include multiple layers formed at different times with the same processing station.

In one embodiment, forming PEN layer 137 during the manufacture of a wafer acts to enhance the performance of an integrated circuit made from the wafer. In one embodiment, using such a PEN layer may increase transistor drive current for given leakage current. In one embodiment, drive current may be increased by 3%. In another embodiment, using such a PEN layer may also reduce parasitic capacitance (e.g. 3%) for an integrated circuit made from the wafer.

It is believe that in some embodiments, the relatively high ratio (e.g. 4:1) of Si—H bonds to N—H bonds aids in confining the extension and halo dopants of the source/drain regions (e.g. 111 and 113) of transistors of wafer 101. In other embodiment, it is believed that multiple interfaces of each layer (e.g. 901, 903, 905, 907, 909, and 911) of PEN layer 137 provides a structure which produces the enhancements listed above.

Providing layer 203 on layer 137, in some embodiments, allows for layer 137 to be removed with the same etching process used to remove layer 203.

In other embodiments, layer 203 may be utilized as an etch stop for forming an edge seal of an integrated circuit.

Figure 10:
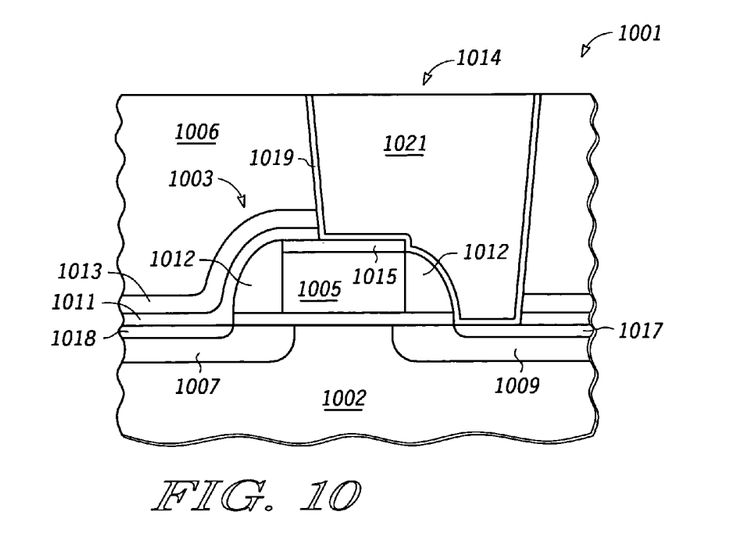
FIG. 10 is a partial side cross-sectional view of an other embodiment of a semiconductor wafer during a stage in its manufacture according to the present invention.

FIG. 10 shows a partial cross-sectional side view of a wafer 1001 according to another embodiment of the present invention. Wafer 1001 includes a substrate made of a semiconductor material (e.g. Si, SiGe) and transistor 1003 having source/drain region 1007 and source/drain region 1009 formed in substrate 1002. Transistor 1003 includes a gate 1005, gate silicide 1015, and sidewall spacer 1012. A layer 1006 of interlayer dielectric material is located over substrate 1002. A contact including filler material 1021 and barrier layer(s) portion 1019 is formed in an opening 1014 of layer 1006. During the etching of opening 1014, layer 1013 is utilized as etch stop layer. Layer 1011 is a PEN layer similar to layer 137. The contact formed from conductive material 1021 and portion 1019 is in electrical contact with gate silicide 1015 and source/drain silicide 1017 to electrically short gate 1005 and source/drain region 1009 together. Utilizing layer 1013 as an etch stop allows for opening 1014 to be formed by an etchant while protecting a portion of spacer 1012 during the etching.

One embodiment includes a method for making a semiconductor device. The method includes forming a plasma enhanced nitride (PEN) layer over a wafer and forming an etch stop layer over the wafer wherein the forming an etch stop layer includes forming a second layer over the PEN layer. The second layer is of a different material than the PEN layer. The method further includes forming a layer of interlayer dielectric material over the second layer, selectively etching through the interlayer dielectric material utilizing the etch stop layer as an etch stop, and selectively etching through the etch stop layer and the PEN layer with an etchant that is non selective with respect to both the PEN layer and the etch stop layer.

In another embodiment, a semiconductor device includes a substrate, a plasma enhanced nitride (PEN) layer overlying the substrate, and a second layer on the PEN layer. The second layer is of a different material than the PEN layer. The second layer includes a nitride. The semiconductor device includes a layer of interlayer dielectric material overlying the second layer.

Another embodiment includes a method for making a semiconductor device. The method includes forming a plasma enhanced nitride (PEN) layer over a wafer and forming an etch stop layer over the wafer wherein the forming the etch stop layer includes forming a second layer including nitride on the PEN layer. The second layer is of a different material than the PEN layer. The method also includes forming a layer of interlayer dielectric material over the second layer and selectively etching though the interlayer dielectric material utilizing the etch stop layer as an etch stop.

Another embodiment includes a method for making a semiconductor device. The method includes forming a plasma enhanced nitride (PEN) layer over a wafer and forming an etch stop layer over the wafer wherein the forming an etch stop layer includes forming a second layer on the PEN layer. The second layer is of a different material than the PEN layer. The method also includes forming a layer of interlayer dielectric material over the second layer and selectively etching though the interlayer dielectric material utilizing the etch stop layer as an etch stop. The second layer has a higher selectivity than the PEN layer with respect to an etch chemistry of an enchant used in the selectively etching.

Another embodiment includes a method for making a semiconductor device. The method including forming multiple plasma enhanced nitride (PEN) layers of the same material on top of each other over a wafer and forming an etch stop layer over the wafer wherein the forming an etch stop layer includes forming a second layer over the multiple PEN layers. The second layer is of a different material than the multiple PEN layers. The method also includes forming a layer of interlayer dielectric material over the second layer and selectively etching though the interlayer dielectric material utilizing the etch stop layer as an etch stop.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method for making a semiconductor device, the method comprising:
   forming a plasma enhanced nitride (PEN) layer over a wafer;
   forming an etch stop layer over the wafer wherein the forming an etch stop layer includes forming a second layer over the PEN layer, the second layer being of a different material than the PEN layer;
   forming a layer of interlayer dielectric material over the second layer;
   selectively etching through the interlayer dielectric material utilizing the etch stop layer as an etch stop;
   selectively etching through the etch stop layer and the PEN layer with an etchant that is non selective with respect to both the PEN layer and the etch stop layer.

2. The method of claim 1 wherein the etchant is selective with respect to the interlayer dielectric material.

3. The method of claim 1 wherein the PEN layer includes silicon.

4. The method of claim 1 wherein the PEN layer includes hydrogen.

5. The method of claim 1 wherein the PEN layer includes at least 20% hydrogen by weight.

6. The method of claim 1 wherein the PEN layer includes multiple layers of the same material.

7. The method of claim 1 wherein the forming the PEN layer includes:
forming a first layer of the PEN layer at a first deposition station of a processing chamber;
forming a second layer of the PEN layer over the first layer of the PEN layer at a second deposition station of the processing chamber.

8. The method of claim 7 wherein the forming the PEN layer includes:
forming a third layer of the PEN layer over the second layer of the PEN layer at a third deposition station of a processing chamber.

9. The method of claim 1 wherein the second layer has a higher selectivity than the PEN layer with respect to an etch chemistry of an enchant used in the selectively etching through the interlayer dielectric material.

10. The method of claim 1 further comprising:
forming a transistor on the wafer;
wherein the etch stop layer is formed over the transistor;
wherein the selectively etching through the interlayer dielectric material includes forming an opening in the layer of interlayer dielectric material for a contact for a source/drain region of the transistor.

11. The method of claim 1 wherein:
the wafer has a semiconductor on insulator (SOI) configuration and includes a semiconductor substrate and a dielectric layer overlying the semiconductor substrate;
the layer of interlayer dielectric material is formed over the dielectric layer;
the selectively etching through the interlayer dielectric material includes etching an opening through the layer of interlayer dielectric material and through the dielectric layer for a contact for the semiconductor substrate.

12. The method of claim 1 wherein the layer of interlayer dielectric material includes TEOS.

13. The method of claim 1 wherein the second layer includes nitrogen.

14. The method of claim 13 wherein the second layer includes hydrogen.

15. The method of claim 1 further comprising:
forming an interconnect over the layer of interlayer dielectric material after the selectively etching through the etch stop layer and the PEN layer.

16. The method of claim 1 wherein the PEN layer enhances a drive current of a transistor of the wafer at a given leakage current.

17. The method of claim 1 further comprising:
planarizing the layer of interlayer dielectric material prior to the selectively etching through the interlayer dielectric material.

18. The method of claim 1 wherein the PEN layer has at least a relatively high ratio of Si—H bonds to N—H bonds.

19. The method of claim 1 wherein the second layer includes silicon rich oxynitride.

20. The method of claim 1 wherein the PEN layer has a thickness of less than 500 A or less.

21. The method of claim 1 wherein the PEN layer is approximately 36% silicon, 53% nitrogen, and 21% hydrogen by atomic weight.

22. A method for making a semiconductor device, the method comprising:
forming a plasma enhanced nitride (PEN) layer over a wafer;
forming an etch stop layer over the wafer wherein the forming the etch stop layer includes forming a second layer including nitride on the PEN layer, the second layer being of a different material than the PEN layer;
forming a layer of interlayer dielectric material over the second layer;
selectively etching though the interlayer dielectric material utilizing the etch stop layer as an etch stop; and
selectively etching through the etch stop layer and the PEN layer after the selectively etching through the interlayer dielectric material.

23. A method for making a semiconductor device, the method comprising:
forming a plasma enhanced nitride (PEN) layer over a wafer;
forming an etch stop layer over the wafer wherein the forming an etch stop layer includes forming a second layer on the PEN layer, the second layer being of a different material than the PEN layer;
forming a layer of interlayer dielectric material over the second layer;
selectively etching though the interlayer dielectric material utilizing the etch stop layer as an etch stop;
wherein the second layer has a higher selectivity than the PEN layer with respect to an etch chemistry of an enchant used in the selectively etching.

24. A method for making a semiconductor device, the method comprising:
forming multiple plasma enhanced nitride (PEN) layers of the same material on top of each other over a wafer;
forming an etch stop layer over the wafer wherein the forming an etch stop layer includes forming a second layer over the multiple PEN layers, the second layer being of a different material than the multiple PEN layers;
forming a layer of interlayer dielectric material over the second layer;
selectively etching though the interlayer dielectric material utilizing the etch stop layer as an etch stop.

25. The method of claim 24 wherein the forming the multiple PEN layer includes:
forming a first layer of the multiple PEN layers at a first deposition station of a processing chamber;
forming a second layer of the multiple PEN layers over the first layer of the multiple PEN layers at a second deposition station of the processing chamber.

26. The method of claim 25 wherein the forming the multiple PEN layers includes:
forming a third layer of the multiple PEN layers over the second layer of the multiple PEN layers at a third deposition station of a processing chamber.

* * * * *